United States Patent [19]

Takano

[11] Patent Number: 5,604,447
[45] Date of Patent: Feb. 18, 1997

[54] PRESCALER IC TESTING METHOD AND TEST PROBE CARD

[75] Inventor: Isamu Takano, Tokyo, Japan

[73] Assignee: NEC Corporation, Tokyo, Japan

[21] Appl. No.: 580,365

[22] Filed: Dec. 28, 1995

[30] Foreign Application Priority Data

Dec. 28, 1994 [JP] Japan .................................. 6-327888

[51] Int. Cl.⁶ .............................. G06F 7/38; G01R 1/04; G01R 31/28
[52] U.S. Cl. .......................... 324/765; 395/800; 324/72.5; 324/73.1
[58] Field of Search ................... 324/765, 73.1, 324/800, 72.5

[56] References Cited

U.S. PATENT DOCUMENTS

| | | | |
|---|---|---|---|
| 4,222,095 | 9/1980 | Stein | 363/8 |
| 5,070,297 | 12/1991 | Kwon et al. | 324/72.5 |
| 5,202,626 | 4/1993 | Pham et al. | 324/73.1 |
| 5,448,747 | 10/1995 | Garverick et al. | 395/800 |

FOREIGN PATENT DOCUMENTS

| | | |
|---|---|---|
| 62-123732 | 6/1987 | Japan . |
| 1-79837 | 5/1989 | Japan . |
| WO84/00087 | 1/1984 | WIPO . |

*Primary Examiner*—Kenneth A. Wieder
*Assistant Examiner*—Barry C. Bowser
*Attorney, Agent, or Firm*—Young & Thompson

[57] ABSTRACT

A probe card includes an oscillator generating an AC signal, an averaged value detecting circuit receiving a signal outputted from a prescaler IC, for generating an averaged DC signal, and a plurality of switches for changing a flow of a signal among the IC tester, the prescaler IC, the oscillator and the averaged value detecting circuit. The switches is so controlled that the AC signal is supplied to the prescaler IC, and the signal outputted from the prescaler IC is supplied to the averaged value detecting circuit and converted to the averaged DC signal, whereby a non-defective/defective of the AC function of the prescaler IC is discriminated on the basis of the obtained averaged DC signal. The switches are also so controlled that a DC test signal is supplied from the IC tester to the prescaler IC and a DC output signal outputted from the prescaler IC is supplied to the IC tester. Thus, both an AC function test and a DC function test can be carried out on the prescaler IC in the form of a wafer by transferring only DC signals between the IC tester and the probe card.

7 Claims, 5 Drawing Sheets

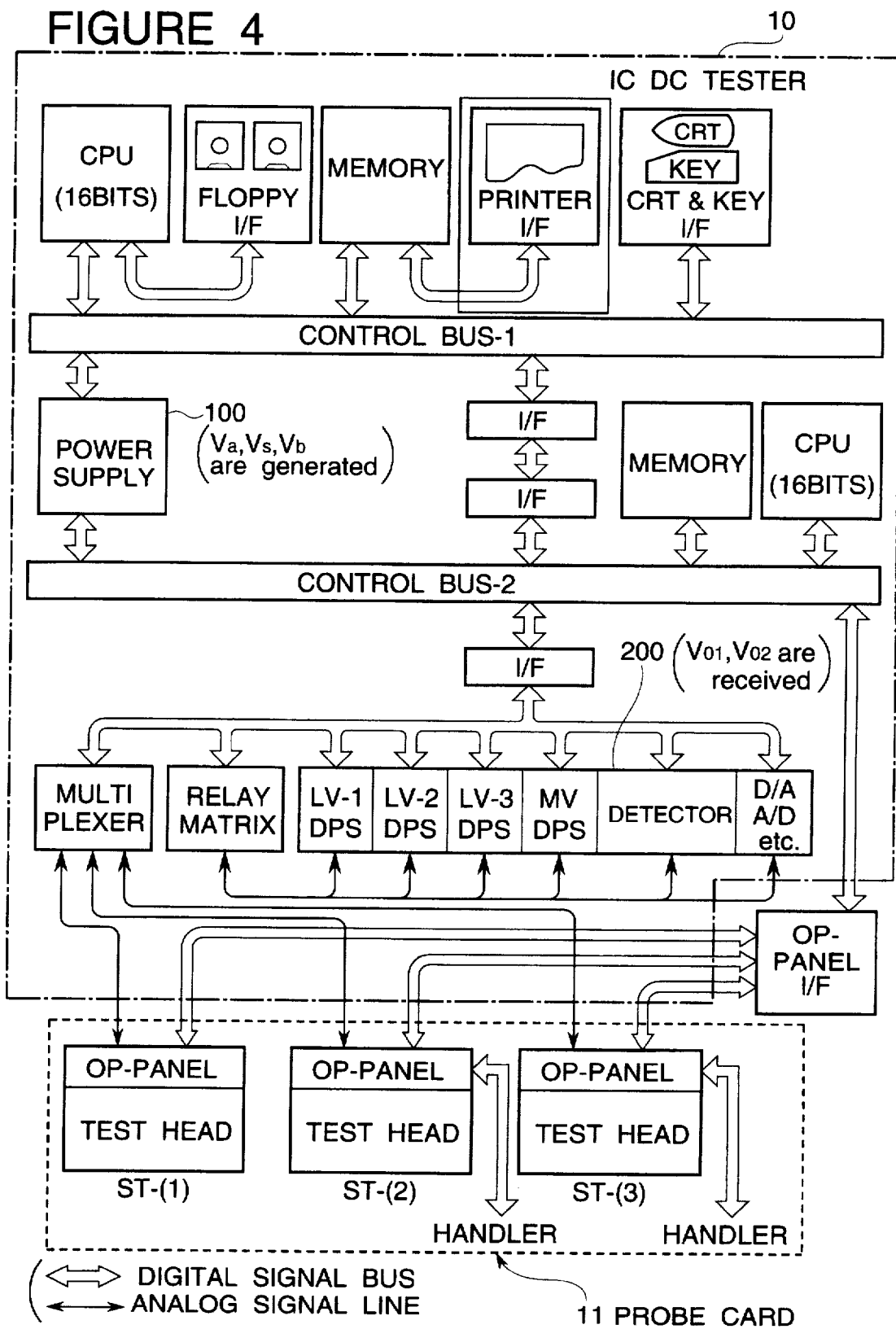

PRESCALER IC TESTING METHOD AND TEST PROBE CARD

BACKGROUND OF THE INVENTION

1. Field of the Invention

The present invention relates to a method for testing a prescaler IC (integrated circuit) and a test probe card, and more specifically to a prescaler IC testing method and a test probe card, which have an AC test function and a DC test function.

2. Description of Related Art

A recent high speed and high integration IC technology is greatly expected as a key technology for constructing a high informazation society. In particular, a high speed and high integration IC such as a prescaler IC has been applied over an extremely wide field from a mobile communication to an audio visual in-home instrument. Because, use of the prescaler IC is increased because a PLL (phase locked loop) technology has been introduced into various systems.

Generally, a process for manufacturing the prescaler IC mainly includes a diffusion process, a wafer check process (conventionally called a "pellet/wafer process" (P/W process)), an assemble process, a sorting process, and a testing process. In particular, the process for checking the characteristics of the prescaler IC includes the wafer check process in which a DC characteristics and an AC characteristics is checked to the ICs in the form of a wafer, and the sorting process in which a DC test/sorting and an AC test/sorting are performed after the IC is packaged.

In these wafer check process and sorting process, the DC test and the AC test are performed by using different IC test probe cards, respectively.

Referring to FIG. 1, a diagram illustrating the probe card and the IC DC tester is shown as one conventional example. An IC DC tester 10 and an IC test probe card 11A as shown in FIG. 1 are used in the wafer check process. Contact probes (not shown) provided at tip ends of wiring patterns 22 formed on the probe card 11A are brought into contact with a prescaler IC 18 to be checked, so that the DC test is performed.

Various information is transferred between the IC DC tester 10 and the probe card 11A. First, on the basis of a test program previously set in the IC DC tester 10, various DC voltages are supplied from the IC DC tester 10 to the probe card 11A. These DC voltages are supplied through the wiring patterns 22 to the prescaler IC 18 as a power supply voltage, an input terminal voltage, etc.

Then, an output voltage is outputted from the prescaler IC 18 to the IC DC tester 10. This output voltage is examined on the basis of a non-defective/defective reference previously set in the IC DC tester 10, so that a non-defective/defective of the prescaler IC 18 is discriminated.

As mentioned above, in the wafer test process, the DC test is performed by using the probe card 11A specialized for only the DC test and having only the wiring patterns formed thereon. Incidentally, in the sorting process performed after packaged, the probe card is not used, and a sorting tool constituted of for example, an IC socket, is used.

Referring to FIG. 2, a diagram illustrating the probe card and the AC tester is shown as another conventional example. An IC AC tester 24 and an IC test probe card 11B as shown in FIG. 2 are used in the wafer check process. Contact probes (not shown) provided at tip ends of wiring patterns 22 formed on the probe card 11B are brought into contact with a prescaler IC 18 to be checked, so that the AC test is performed.

The AC tester 24 includes an AC signal source 25 and an AC testing circuit 26. The AC signal source 25 supplies AC signals to the prescaler IC 18 connected to the probe card 11B, and AC output signals obtained from the prescaler IC 18 are examined by the AC testing circuit 26, similarly to the DC test.

Also in this case, the probe card 11B has only the wiring patterns formed thereon. In addition, in the sorting process performed after packaged, the probe card is not used, and a sorting tool is used, similarly to the DC test.

In the case of using the construction shown in FIG. 1, only the DC test can be performed. As a result, ICs which are defective from the viewpoint of the AC operation but which cannot be excluded in the DC test, are supplied to a next step, namely, the assembling process in which an additional value is added.

On the other hand, in the case of using the construction shown in FIG. 2, the AC test must be performed after the wafer check (DC test) is performed using the construction shown in FIG. 1. As a result, the number of steps required in the wafer check process is increased, and an equipment for the AC test is required in the wafer check process.

In order to overcome the above mentioned problem, for example, Japanese Utility Model Application Pre-examination Publication No. Heisei 1-79837 proposed to provide a probing block for the AC test and another probing block for the DC test on a single probe card, so that different IC chips are simultaneously checked. In this proposal, however, both the IC DC tester and the AC tester are required as the testing equipment. In addition, when the test goes from the DC test to the AC test, it is necessary to move the probe card, or to move the wafer, with the result that a test time inevitably becomes long. In other words, the processing capacity drops.

Furthermore, Japanese Patent Application Pre-examination Publication No. Showa 62-123732 proposed to provide a plurality of checking circuits on the probe card. In this construction, however, the checking circuits only check the output signals from the ICs to be checked, but no attention is paid to the input signal to be supplied to the ICs to be checked. In addition, the relation of signal transfer between the testing equipment and the ICs to be checked is indefinite and therefore not practical.

SUMMARY OF THE INVENTION

Accordingly, it is an object of the present invention to provide a prescaler IC testing method which has overcome the above mentioned defects of the conventional ones.

Another object of the present invention is to provide a prescaler IC testing method capable of carrying out, in the wafer check process, the DC test/sorting and the AC test/sorting which were, in the prior art, performed in the sorting process after packaged, so that a defective IC can be excluded at an early stage, whereby the individual tests performed in the sorting process can be changed into a sampling test.

Still another object of the present invention is to provide a test probe card capable of simplifying the testing equipment and shortening the test time (namely, reducing the number of test steps).

A further object of the present invention is to provide a test probe card capable of simplifying the testing equipment and shortening the test time, and also capable of elevating the test precision.

The above and other objects of the present invention are achieved in accordance with the present invention by a prescaler IC testing method using an IC DC tester and a probe card which is connected to the IC tester and on which a prescaler IC to be tested is mounted, the method performing a function test of the prescaler IC in the form of a wafer by transferring DC signals between the IC tester and the probe card, the probe card including an AC signal generating means for generating an AC signal having the frequency lower than a frequency-divided frequency region of the prescaler IC, an averaged value detecting means receiving a signal outputted from the prescaler IC, for generating an averaged DC signal, and a plurality of signal switch means controlled by a control signal from the IC DC tester for changing a flow of a signal among the IC DC tester, the prescaler IC, the AC signal generating means and the averaged value detecting means, the method comprising the step of carrying out the AC test by controlling the signal switch means so that the AC signal generated by the AC signal generating means is supplied to the prescaler IC, and the signal outputted from the prescaler IC is supplied to the averaged value detecting means and converted to the averaged DC signal, whereby a non-defective/defective of the prescaler IC is discriminated on the basis of the obtained averaged DC signal, and the method also comprising the step of carrying out the DC test by controlling the signal switch means so that a DC test signal is supplied from the IC DC tester to the prescaler IC and a DC output signal outputted from the prescaler IC is supplied to the IC DC tester.

According to another aspect of the present invention, there is provided a test probe card to be coupled with an IC tester so as to transfer signals between the test probe card and the IC tester, and to enable to perform a function test of the prescaler IC in the form of a wafer, the test probe card comprising an AC signal generating means receiving a DC drive control signal from the IC tester for generating an AC signal having a predetermined frequency, a first switch means for supplying an output of the AC signal generating circuit to the prescaler IC, a second switch means receiving a DC test signal from the IC tester to supply the received DC test signal to the prescaler IC, a third switch means receiving a DC output signal from the prescaler IC to supply the received DC output signal to the IC tester, a fourth switch means receiving an AC output signal from the prescaler IC, a pulse width conversion means receiving the AC output signal of the prescaler IC through the fourth switch means, for converting it into a pulse having a predetermined pulse width, and an averaged value detecting means receiving an output of the pulse width conversion means, for outputting an averaged value to the IC DC tester, the first to fourth switch means being controlled by a DC control signal from the IC tester in such a manner that when the first and fourth switched means are in a closed condition, the second and third switch means are in an open condition and the AC test is carried out, and when the second and third switch means are in the closed condition, the first and fourth switched means are in the open condition and the DC test is carried out, whereby both the AC test and the DC test can be carried out by transferring only the DC signals between the IC tester and the test probe card.

In one embodiment, there is further provided a bandpass filter means receiving the output of the AC signal generating means, for supplying to the first switch means a signal from which a noise component is removed.

In addition, there is further provided a variable attenuating means means receiving the output of the AC signal generating means, and controlled by a DC control signal from the IC tester so as to supply the attenuated signal to the first switch means.

The above and other objects, features and advantages of the present invention will be apparent from the following description of preferred embodiments of the invention with reference to the accompanying drawings.

BRIEF DESCRIPTION OF THE DRAWINGS

FIG. 4 is a block diagram illustrating the whole construction of the IC DC tester which can be used in combination with the test probe card in accordance with the present invention;

DESCRIPTION OF THE PREFERRED EMBODIMENTS

Now, embodiment of the present invention will be described with reference to the drawings.

Figure 1:
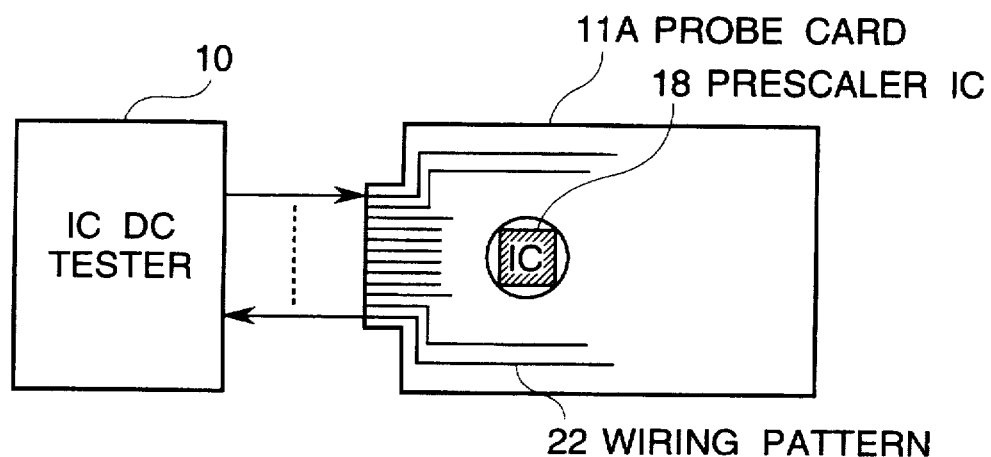
FIG. 1 is a diagram illustrating one conventional example of the probe card and the IC DC tester.
Figure 2:
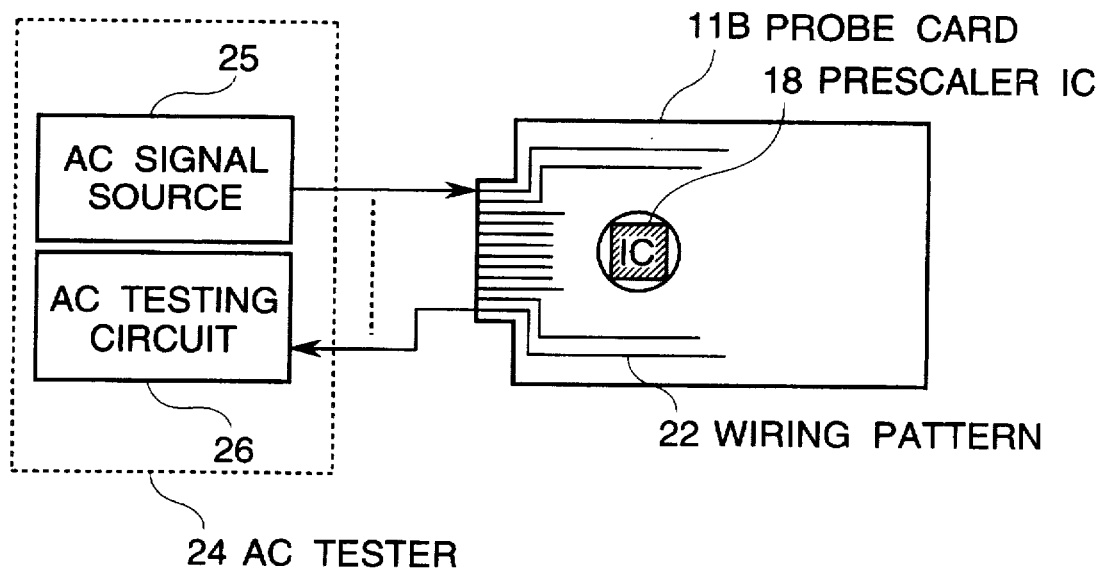
FIG. 2 is a diagram illustrating one conventional example of the probe card and the AC tester.
Figure 3:
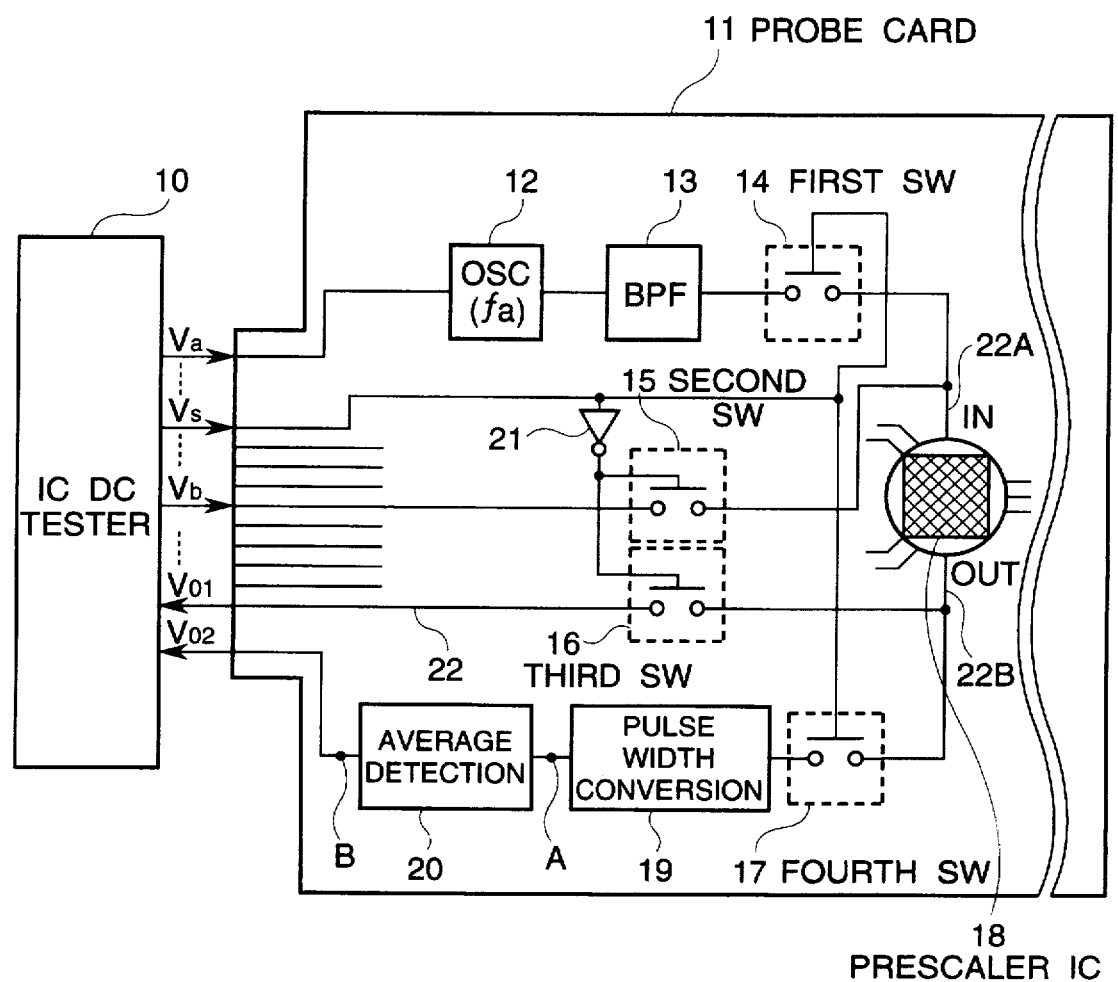
FIG. 3 is a diagram of one embodiment of the test probe card in accordance with the present invention, for explaining an embodiment of the prescaler IC testing method in accordance with the present invention.

Referring to FIG. 3, there is shown a diagram of an embodiment of the test probe card in accordance with the present invention, illustrating a signal transfer between the IC tester and the IC to be tested, for the purpose of explaining an embodiment of the prescaler IC testing method in accordance with the present invention.

As shown in FIG. 3, the embodiment of the prescaler IC testing method in accordance with the present invention uses an IC DC tester 10 and a test probe card 11, as an IC testing equipment. Contact probes (not shown) provided at tip ends of wiring patterns 22 formed on the probe card 11 are brought into contact with a prescaler IC 18 to be tested, so that DC signals are transferred between the IC DC tester 10 and the prescaler IC 18 in the form of a wafer. However, according to the present invention, both the AC test and the DC test are performed on the prescaler IC 18 which has not yet been cut out from the wafer.

For the purpose of carrying out both the AC test and the DC test by use of the IC DC tester 10 and the same test probe card 11, the test probe card 11 includes a sine wave generating circuit (OSC) 12 receiving a DC voltage Va from the IC DC tester 10 and operating in a divided frequency region of the prescaler IC 18, a bandpass filter (BPF) 13 connected to an output of the OSC 12, and four switches 14 to 17 on-off controlled by a DC switch control signal Vs from the IC DC tester 10. One of the four switches 14 is controlled directly by the DC switch control signal Vs, and is connected between an output of the bandpass filter 13 and one wiring pattern 22A formed on the probe card 11, which is connected to an input terminal (not shown) of prescaler IC 18. Another of the four switches 17 is controlled directly by the DC switch control signal Vs, and is connected at its one end to another wiring pattern 22B formed on the probe card 11, which is connected to an output terminal (not shown) of prescaler IC 18.

The test probe card 11 also includes a pulse width converting circuit 19 having an input connected to the other end of the switch 17 for receiving an output signal from the prescaler IC 18 so as to change the pulse width of the received output signal, and an averaged voltage detecting circuit 20 having an input connected to an output node "A" of the pulse width converting circuit 19 and for outputting an averaged value voltage from its output node "B" to the IC DC tester 10 as a DC output voltage Vo2.

Furthermore, the DC switch control signal Vs is supplied to an inverter 21, and the remaining two switches 15 and 16 are controlled by an output of the inverter 21, namely, by an inverted signal of the DC switch control signal Vs. One end of the switch 15 is connected to receive a DC test voltage Vb from the IC DC tester 10 and the other end of the switch 15 is connected to the wiring pattern 22A. One end of the switch 16 is connected to the wiring pattern 22B, and the other end of the switch 16 is connected to output the voltage from the wiring pattern 22A to the IC DC tester 10 as a DC output voltage VO1.

Here, referring to FIG. 4, there is shown a block diagram illustrating the whole construction of the IC DC tester which can be used in combination with the test probe card shown in FIG. 3. Since the IC DC tester itself should have been known to persons skilled in the art, a detailed explanation of the construction and the operation will be omitted. In FIG. 4, a single solid line shows an analog signal line, and digital signals are transferred on a bus line. The above mentioned voltages Va, Vs and Vb are generated in a power supply 100, and the output voltage VO1 and VO2 are supplied to a detector 200.

With this arrangement, it is possible to carry out two kinds of AC test, namely, a first AC test when the prescaler IC 18 performs a frequency dividing operation, and a second AC test when the prescaler IC 18 self-oscillates, and thereafter, to carry out the DC test. However, the DC test may be carried out before the AC tests.

When the AC test is carried out, an active DC switch control signal Vs is supplied from the IC DC tester 10 to the test probe card 11. This DC switch control signal Vs is fed through the wiring pattern 22 to the four switches so as to bring the first and fourth switches 14 and 17 into a closed condition and the second and third switches 15 and 16 into an open condition.

Then, the DC driving control signal (DC voltage) Va is supplied from the IC DC tester 10 so as to put the sine wave generating circuit (OSC) 12 into an operating condition. This OSC 12 generates a sine wave signal having a previously set frequency ($fa$). This frequency $fa$ is set to be sufficiently lower than a frequency-divided frequency of a free-running oscillation frequency ($fosc$) of the prescaler IC 18, in order that the frequency-dividing operation of the prescaler IC 18 is surely performed, and in order to clearly distinguish the frequency-dividing operation from the free-running operation. For example, assuming that the frequency-dividing number is "N" and the free-running oscillation frequency ($fosc$) is 2 GHz, the oscillation frequency $fa$ of the OSC 12 is set to be on the order of 20 MHz.

Unnecessary noise components of the oscillation signal generated by the OSC 12 is removed by the bandpass filter 12, and the filtered signal is supplied through the first switch 14 to the prescaler IC 18.

Figure 5A:
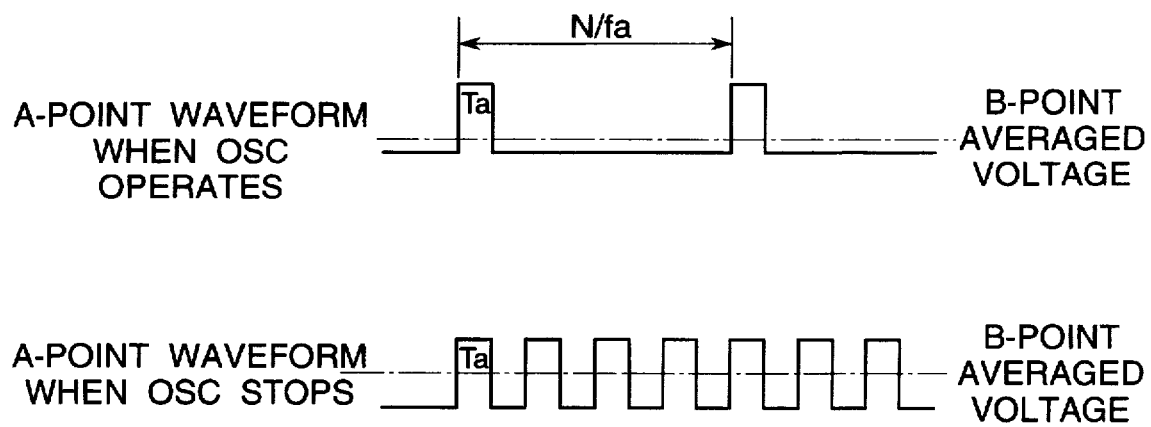
FIG. 5A illustrates a waveform when the sine wave generating circuit is put in operation, and a waveform when the sine wave generating circuit does not operate.

Here, assuming that the prescaler IC 18 operates normally, an output signal having a frequency of $fa/N$ is outputted through the fourth switch 17 to the pulse width converting circuit 19, as shown in FIG. 5A. This pulse width converting circuit 19 detects a rising edge of the received signal and outputs a pulse which rises up in synchronism with the rising edge of the received signal and which has a predetermined pulse width (Ta). This pulse width Ta is preferred to be not greater than one half of the period of the output signal appearing when the prescaler IC 18 freely oscillates, in order to ensure that even if the free-running oscillation signal is outputted from the prescaler IC 18 to the pulse width converting circuit 19, a pulse having a desired pulse repetition frequency is outputted from the pulse width converting circuit 19. For example, when the free-running oscillation signal has the frequency of 200 MHz, the pulse width Ta is set on the order of 2 nsec. The signal having the pulse width Ta, which is outputted from the pulse width converting circuit 19, and which has the same repetition period as that of the signal outputted from the prescaler IC 18, is supplied to the DC averaged voltage detection circuit 20, where an averaged DC voltage is detected and outputted to the IC DC tester 10 as the DC output signal VO2 of the AC test, as shown in FIG. 5A.

If the prescaler IC 18 malfunctions, the DC output signal VO2 is different from a predetermined expected value, and therefore, it is possible to discriminate the non-defective/defective by the IC DC tester 10.

Thereafter, if the supply of the DC drive control signal Va from the IC DC tester 10 is stopped, the OSC 12 stops its oscillation, so that the input of the prescaler IC 18 is brought into a no-signal condition. As a result, the prescaler IC 18 is brought to the free-running oscillating condition, so that a signal having the frequency of 1/N of the free-running oscillation frequency $fosc$ is outputted from the prescaler IC 18. Thus, the DC output signal VO2 is outputted to the IC DC tester 10, similarly to the above mentioned operation when the OSC 12 is in the oscillating condition. In this case, however, as shown in FIG. 5A, the repetition frequency of the output ("A" point) of the pulse width converting circuit 19 is higher than that when the OSC 12 operates, and therefore, the averaged voltage ("B" point) outputted from the averaged voltage detecting circuit 20 is also higher than that when the OSC 12 operates.

Figure 5B:
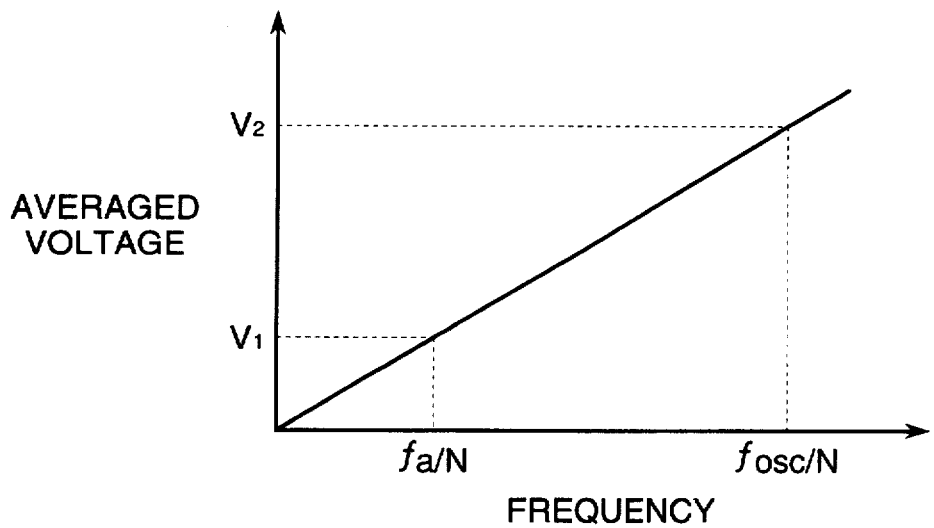
FIG. 5B is a graph illustrating the relation between the frequency and the averaged voltage.

In the above mentioned AC test, the averaged voltage on the "B" point is supplied to the IC DC tester 10 as the DC output signal VO2. If the prescaler IC is non-defective, the two averaged voltages (or currents) V1 and V2 as shown in FIG. 5B are detected. Therefore, if a value different from the two reference voltages of V1 and V2 is detected, it can be deemed that the prescaler IC 18 under test operates at the outside of a set operation range. In other words, by checking the value of V1 and V2, it is possible to discriminate a normality/abnormality of the AC operation of the prescaler IC 18.

On the other hand, when the DC test is carried, first, the DC switch control signal Vs from the IC DC tester 10 is deactivated, so as to flip the four switches 14 to 17. Namely, the switches 15 and 16 are put in the closed condition and the switches 14 and 17 are put in the open condition.

In this condition, even if the OSC 12 oscillates, the output signal of the OSC 12 is in no way supplied to the prescaler IC 18, and the output signal from the prescaler IC 18 is never supplied to the pulse width conversion circuit 19 and the averaged voltage detecting circuit 20. On the other hand, the prescaler IC 18 is connected to the IC DC tester 10 through the second and third switches 15 and 16.

Therefore, the DC test signal Vd is applied from the IC DC tester 10 to the prescaler IC 18. An output signal of the prescaler IC 18 is supplied to the IC DC tester 10 as the DC output signal VO1. Thus, the IC DC tester 10 can perform the DC test for the prescaler IC 18.

As seen from the above, if the prescaler IC test method as mentioned above is performed, the AC test/sorting and the DC test/sorting which were performed in the sorting process after packaged in the prior art, can be performed in the wafer check process, and therefore, it is possible to exclude a defective IC at an early stage. Therefore, the individual test in the sorting process can be changed into a sampling test. Thus, an intermediate process of the IC manufacturing process can be simplified.

In addition, as seen from the above, the test probe card 11 includes the sine wave generating circuit (OSC) 12 receiving the DC drive control signal Va from the IC DC tester for generating the sine wave signal having the predetermined frequency $fa$, the bandpass filter 13 removing the noise component from the output of the OSC 12, the first switch 14 for supplying the output of the bandpass filter 13 to the prescaler IC 18, the second switch 15 for supplying the DC test signal Vb from the IC DC tester 10 to the prescaler IC 18, the third switch 16 receiving the DC output signal VO1 from the prescaler IC 18 to the IC DC tester 10, the fourth switch 17 for receiving and transferring the AC output signal of the prescaler IC 18, the pulse width conversion circuit 18 receiving the AC output signal of the prescaler IC 18 through the fourth switch 17, for converting it into the pulse having the predetermined pulse width, and the averaged voltage (or current) detecting circuit 20 receiving the output of the pulse width conversion circuit 18, for outputting the averaged voltage (or current) signal VO2 to the IC DC tester 10.

In the above mentioned test probe circuit 11, it is sufficient if the OSC 12 operates at a low frequency. Therefore, the OSC 12 can be composed of a free-running multivibrator of a TTL structure, and therefore, can be realized at a low cost. In addition, the pulse width converting circuit 19 can be constituted of a re-triggerable monostable multivibrator. Therefore, the above mentioned test probe circuit 11 can be simply constructed.

In addition, the above mentioned test probe circuit 11 can perform both the AC test and the DC test by using only the DC signals Va, Vb, Vs, VO1 and VO2, if the first and fourth switches 14 and 17 and the second and third switches 15 and 16 are on-off controlled in a phase opposite to each other in response to the DC switch control signal Vs from the IC DC tester 10.

Figure 6:
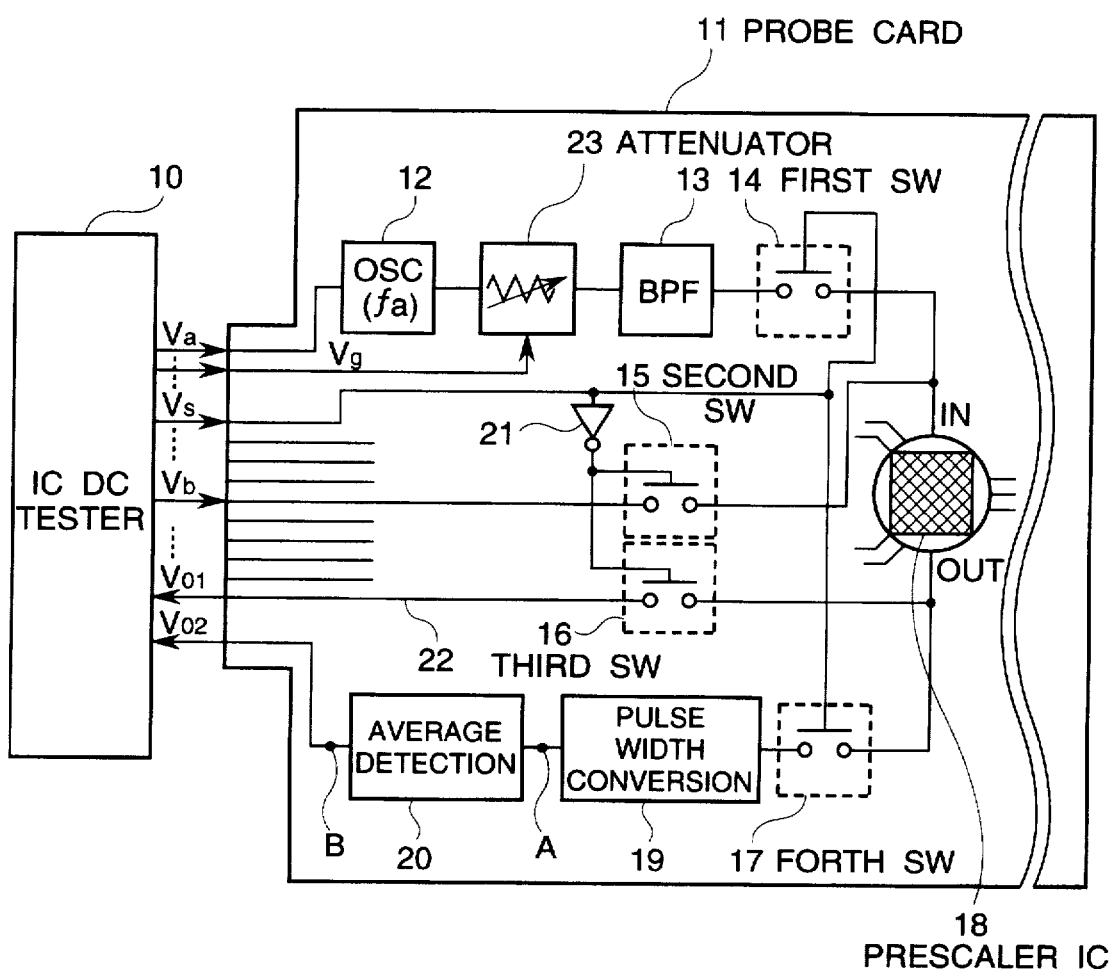
FIG. 6 is a diagram of another embodiment of the test probe card in accordance with the present invention, for explaining the embodiment of the prescaler IC testing method in accordance with the present invention.

Referring to FIG. 6, there is shown a diagram of a second embodiment of the test probe card in accordance with the present invention, for explaining the embodiment of the prescaler IC testing method in accordance with the present invention. In FIG. 6, elements similar to those shown in FIG. 3 are given the same Reference Numerals, and the explanation thereof will be omitted.

As seen form comparison between FIGS. 3 and 6, the second embodiment includes a variable attenuator 23 connected between the OSC 12 and the bandpass filter 13 and controlled by a DC attenuation control signal Vg from the IC DC tester 10. This variable attenuator 23 can be constituted of a PIN diode, for example. In the AC test, by controlling the attenuation amount of the variable attenuator 23 by the DC attenuation control signal Vg from the IC DC tester 10, it is possible to change the level of the signal applied to the prescaler IC 18. Namely, by changing the level of the signal applied to the prescaler IC 18, it is possible to perform an input sensitivity as one item of the AC test for the prescaler IC 18.

A fundamental construction and a fundamental operation of the test probe card shown in FIG. 6 are the same as those of the test probe card shown in FIG. 3, and therefore, explanation thereof will be omitted.

As seen from the above, the prescaler IC test method in accordance with the present invention utilizes the probe card which is used in the wafer check of the prescaler IC and which includes the AC signal source and the AC-to-DC conversion means, so that only the DC signals are transferred between the IC tester and the probe card. Therefore, it is possible to carry out, in the wafer check process, both the AC test/sorting and the DC test/sorting which were performed in the sorting process after packaged in the prior art, and therefore, it is possible to exclude a defective IC at an early stage. Accordingly, the individual test in the sorting process can be changed into a sampling test. Thus, an intermediate process of the IC manufacturing process can be simplified.

In other words, the DC characteristics defective and the AC DC characteristics defective can be found out and excluded in the wafer stage, and therefore, the percentage of defective products after packaged can be greatly reduced, so that a wasteful cost can be remarkably cut out. In addition, as mentioned above, since the individual test in the sorting process after packaged can be changed into a sampling test, so that the manufacturing process can be simplified, and on the other hand, the production amount can be increased. Furthermore, since the equipment cost can be made to about one fifty of the conventional example, the IC can inexpensively produced.

Furthermore, the test probe card in accordance with the present invention includes the sine wave generating circuit for supplying the sine wave signal to the prescaler IC, the averaged value detecting circuit for outputting the averaged value of the signal outputted from the prescaler IC, and a plurality of switches for changing over between the AC test and the DC test. With this arraignment, since the test probe card limits the signals transferred between the IC tester and the probe card, to only the DC signals, it is possible to carry out the AC test by using no AC tester. This is very advantageous in simplifying the test equipment.

In addition, only by switching the switches by the DC signal, the test probe card in accordance with the present invention can perform the AC test and the DC test without interrupt. Accordingly, the test time and the number of necessary steps can be reduced.

Furthermore, if the variable attenuator is provided after the sine wave generating circuit and is controlled by the DC signal from the IC DC tester, the input sensitivity test in the AC test for the prescaler IC can be performed in the wafer stage. This is very effective in simplifying the test equipment, in shortening the test time, and in elevating the test precision.

The invention has thus been shown and described with reference to the specific embodiments. However, it should be noted that the present invention is in no way limited to the details of the illustrated structures but changes and modifications may be made within the scope of the appended claims.

I claim:

1. A prescaler IC testing method using an IC DC tester and a probe card which is connected to the IC tester and on which a prescaler IC to be tested is mounted, the method performing a function test of the prescaler IC in the form of a wafer by transferring DC signals between the IC tester and the probe card, the probe card including an AC signal generating means for generating an AC signal having the frequency lower than a frequency-divided frequency region of said prescaler IC, an averaged value detecting means receiving a signal outputted from said prescaler IC, for generating an averaged DC signal, and a plurality of signal switch means controlled by a control signal from said IC DC tester for changing a flow of a signal among said IC DC tester, said prescaler IC, said AC signal generating means and said averaged value detecting means, the method comprising the step of carrying out the AC test by controlling said signal switch means so that said AC signal generated by said AC signal generating means is supplied to said prescaler IC, and said signal outputted from said prescaler IC is supplied to said averaged value detecting means and converted to said averaged DC signal, whereby a non-defective/defective of said prescaler IC is discriminated on the basis of the obtained averaged DC signal, and the method also comprising the step of carrying out the DC test by controlling said signal switch means so that a DC test signal is supplied from said IC DC tester to said prescaler IC and a DC output signal outputted from said prescaler IC is supplied to said IC DC tester.

2. A prescaler IC testing method claimed in claim 1 wherein said test probe card comprises an AC signal generating means receiving a DC drive control signal from said IC tester for generating an AC signal having a predetermined frequency, a first switch means for supplying an output of said AC signal generating circuit to said prescaler IC, a second switch means receiving a DC test signal from said IC tester to supply the received DC test signal to said prescaler IC, a third switch means receiving a DC output signal from said prescaler IC to supply the received DC output signal to said IC tester, a fourth switch means receiving an AC output signal from said prescaler IC, a pulse width conversion means receiving said AC output signal of said prescaler IC through said fourth switch means, for converting it into a pulse having a predetermined pulse width, and an averaged value detecting means receiving an output of said pulse width conversion means, for outputting an averaged value to said IC DC tester, said first to fourth switch means being controlled by a DC control signal from said IC tester in such a manner that when said first and fourth switched means are in a closed condition, said second and third switch means are in an open condition and said AC test is carried out, and when said second and third switch means are in the closed condition, said first and fourth switched means are in the open condition and said DC test is carried out, whereby both the AC test and the DC test can be carried out by transferring only the DC signals between said IC tester and said test probe card.

3. A prescaler IC testing method claimed in claim 2 wherein said test probe card further includes a bandpass filter means receiving said output of said AC signal generating means, for supplying to said first switch means a signal from which a noise component is removed.

4. A prescaler IC testing method claimed in claim 2 wherein said test probe card further includes a variable attenuating means means receiving said output of said AC signal generating means, and controlled by a DC control signal from said IC tester so as to supply the attenuated signal to said first switch means.

5. A test probe card to be coupled with an IC tester so as to transfer signals between the test probe card and the IC tester, and to enable to perform a function test of the prescaler IC in the form of a wafer, the test probe card comprising an AC signal generating means receiving a DC drive control signal from said IC tester for generating an AC signal having a predetermined frequency, a first switch means for supplying an output of said AC signal generating circuit to said prescaler IC, a second switch means receiving a DC test signal from said IC tester to supply the received DC test signal to said prescaler IC, a third switch means receiving a DC output signal from said prescaler IC to supply the received DC output signal to said IC tester, a fourth switch means receiving an AC output signal from said prescaler IC, a pulse width conversion means receiving said AC output signal of said prescaler IC through said fourth switch means, for converting it into a pulse having a predetermined pulse width, and an averaged value detecting means receiving an output of said pulse width conversion means, for outputting an averaged value to said IC DC tester, said first to fourth switch means being controlled by a DC control signal from said IC tester in such a manner that when said first and fourth switched means are in a closed condition, said second and third switch means are in an open condition and an AC test is carried out, and when said second and third switch means are in the closed condition, said first and fourth switched means are in the open condition and a DC test is carried out, whereby both the AC test and the DC test can be carried out by transferring only the DC signals between said IC tester and said test probe card.

6. A test probe card claimed in claim 5 further including a bandpass filter means receiving said output of said AC signal generating means, for supplying to said first switch means a signal from which a noise component is removed.

7. A test probe card claimed in claim 5 further including a variable attenuating means means receiving said output of said AC signal generating means, and controlled by a DC control signal from said IC tester so as to supply the attenuated signal to said first switch means.

* * * * *